United States Patent [19]

Ota et al.

[11] Patent Number: 5,387,443
[45] Date of Patent: Feb. 7, 1995

[54] LASER CVD METHOD FOR SYNTHESIZING DIAMOND

[75] Inventors: Nobuhiro Ota; Naoji Fujimori; Kenichi Watanabe, all of Hyogo, Japan

[73] Assignee: Sumitomo Electric Industries, Ltd., Osaka, Japan

[21] Appl. No.: 90,282

[22] Filed: Jul. 8, 1993

[30] Foreign Application Priority Data

Jul. 9, 1992 [JP] Japan .................. 4-182617

[51] Int. Cl.$^6$ .............................................. B05D 3/06
[52] U.S. Cl. ................................. 427/586; 427/596; 427/249; 427/255.5; 423/446
[58] Field of Search ............... 427/590, 596, 586, 249, 427/122, 255.5; 428/408; 156/DIG. 68; 423/446

[56] References Cited

U.S. PATENT DOCUMENTS

| | | |
|---|---|---|
| 3,030,187 | 4/1962 | Eversole . |
| 3,030,188 | 4/1962 | Eversole . |
| 4,711,790 | 12/1987 | Morishige ............................ 427/586 |
| 4,948,629 | 8/1990 | Hacker et al. ....................... 427/596 |
| 4,994,301 | 2/1991 | Kusumoto et al. .................. 427/586 |
| 5,154,945 | 10/1992 | Baldwin et al. ...................... 427/596 |

FOREIGN PATENT DOCUMENTS

| | | |
|---|---|---|
| 0382341 | 8/1990 | European Pat. Off. . |
| 61-236691 | 10/1986 | Japan . |
| 63-288991 | 11/1988 | Japan . |
| 63-288992 | 11/1988 | Japan . |
| 90-161416 | 4/1990 | Japan . |
| 3-51675 | 8/1991 | Japan . |
| 85-185956 | 8/1991 | Japan . |
| 339134 | 7/1956 | U.S.S.R. . |

OTHER PUBLICATIONS

"Synthesis of Diamond By Laser-Induced Chemical Vapor Deposition" by Kitahama et al. Appl. Phys. Lett 49 Sep. 1986 pp. 634–635.

"Mask-Free Preparation of Carbon Layers on Substrates" Wendt et al, Chemical Abstracts, vol. 103, No. 22, Dec. 1985, Abstract No. 182431s, p. 275.

"Vapor Deposition of Diamond Particles From Methane" by Matsumoto et al.; Japanese Journal of Applied Physics, vol. 21, No. 4, Apr. 1982, pp. L183–L185.

*Primary Examiner*—Roy V. King
*Attorney, Agent, or Firm*—W. G. Fasse; W. F. Fasse

[57] ABSTRACT

A method for synthesizing a diamond by vapor deposition permits selectively growing high quality diamond on any desired region of a base material at a lower temperature compared to respective conventional temperatures starting with a raw material gas which is prepared by diluting a compound containing carbon atoms such as methane with hydrogen gas. This diluted raw material gas is irradiated with a laser beam satisfying at least one of the following two conditions, namely a spread angle of $1 \times 10^{-1}$ mrad to $5 \times 10^{-1}$ mrad during oscillation or a half-power band width of $1 \times 10^{-4}$ nm to $1 \times 10^{-1}$ nm with respect to a band width of an oscillation having a wavelength of 190 nm to 360 nm. Diamond is deposited on the base material from a chemical species generated by such irradiation.

10 Claims, 4 Drawing Sheets

LASER CVD METHOD FOR SYNTHESIZING DIAMOND

FIELD OF THE INVENTION

The present invention relates to a laser vapor deposition technique for diamond, and more particularly, it relates to a technique through which high quality diamond can be formed at a low temperature of not more than about 300° on a base material having a three-dimensionally complicated shape.

BACKGROUND INFORMATION

The vapor deposition technique for diamond was started by Derjaguin in 1956 (USSE Inv. Certi. No. 339134, 1958) and Eversole in 1958 (U.S. Pat. Nos. 3,030,187 and 3,030,188). Since then further developments have been made in a study by Matsumoto et al. in 1982 (Jpn. J. Appl. Phys., 21, 1982, L183). In such development, various low pressure vapor deposition methods such as thermal CVD, plasma CVD, ion beam deposition, optical CVD, laser CVD and the like have been studied for synthesizing diamond.

For example, the following is a list of subjects of such a vapor deposition technique for diamond:

(1) Improvement in efficiency for film formation;
(2) Temperature reduction in a synthetic process;
(3) Suppression of damage on a base material; and
(4) Selective growth on a desired region.

Among these items, temperature reduction in a synthetic process and selective growth on a desired region are extremely important subjects for implementing various uses of vapor-deposited diamond.

Techniques of vapor-depositing diamond at lower temperatures, plasma-generating CVD techniques such as dc discharge plasma CVD and microwave plasma CVD should first be considered. In the dc discharge plasma CVD, a diamond film is formed in a range of a relatively low vacuum of 150 to 200 Torr at a temperature of about 500° C. With regard to the microwave plasma CVD, it has been reported that vapor deposition was carried out at a temperature of about 400° C. In the dc discharge plasma CVD, however, an abnormal glow discharge can be carried out only in an extremely limited range on an anode. Therefore, this method is remarkably disadvantageous for selectively growing diamond on a desired region of a base material to be provided with diamond. In the microwave plasma CVD, a region allowing formation of diamond is restricted since it is difficult to stably concentrate the discharge to a desired region of base materials having various three-dimensional shapes. Further, a method employing plasma has a disadvantage in that the surface of a base material is damaged by the plasma. While it is possible to attain a temperature reduction in a process by employing the aforementioned plasma CVD, awaited is a technique for coating a base material which is weaker against heat, such as plastic, for example, with diamond for implementing various uses of vapor-deposited diamond. For diamond coating a plastics material, it is necessary to reduce the temperature of the process below 200° C., more preferably below 100° C.

On the other hand, there has been studied a technique of employing light for decomposing and exciting a raw material gas, in order to further reduce the temperature of the process. More specifically, a CVD technique, employing ultraviolet radiation from an excimer laser, a mercury lamp, a deuterium lamp or a rare gas lamp, and a CVD technique employing synchrotron radiation (SR), for example, as ultraviolet radiation of shorter wavelength have been studied. However, it is difficult to generally carry out the CVD employing SR since an apparatus for emitting synchrotron radiation is extremely high-priced and hard to operate.

Various methods using a CVD employing ultraviolet radiation from an excimer laser or the like have also been studied. For example, Japanese Patent Publication No. 3-51675 (1991) discloses a method of irradiating a hydrocarbon reaction gas with high power ultraviolet radiation for decomposing the reaction gas and depositing carbon atoms liberated from the reaction gas on a heated base material. According to this method, a mixed gas of acetylene and hydrogen (acetylene concentration: 10%) is supplied in a reactor and an Si substrate which is heated to 500° C. is irradiated with a KrF excimer laser beam (wavelength: 248 nm) for carrying out vapor deposition, for example. In the prior art disclosing mere employment of an excimer laser beam etc. for photodecomposition, however, it has been impossible to form high quality diamond having a sufficient intensity of a diamond peak at 1333 $cm^{-1}$ in Raman spectrometry. It is believed that this lack of intensity is due to the fact that generally employed ultraviolet radiation such as the excimer laser beam cannot photodecompose $H_2$, and atomic active hydrogen, which is conceivably an important chemical species for vapor deposition of diamond, is not sufficiently generated.

In the light of the above, a modified method of additionally generating plasma by dc discharge, RF or microwaves has been developed in a CVD technique of applying a laser beam etc. to photodecomposition. According to said modified method, it is possible to generate hydrogen atoms and form diamond of relatively high quality at a relatively low temperature. However, in the modified method it is necessary to generate plasma in an area which is as close as possible to a substrate in consideration of a mean free path. In order to deposit diamond on a three-dimensional region of a base material, therefore, an apparatus of a considerably complicated mechanism is required for uniformly diffusing atomic hydrogen on a base material surface. Further, the employment of the plasma facilitates the deterioration of the base material surface by the plasma and diamond is disadvantageously formed on an unnecessary area by decomposition of a carbon source in the plasma or the quality of the deposit is substantially reduced by an excessive supply of carbon.

SUMMARY OF THE INVENTION

It is an object of the present invention to provide a diamond synthetic method which can sufficiently respond to the particularly important characteristics in the diamond vapor deposition, i.e., to achieve a temperature reduction in the synthetic process and a selective growth on a desired region of a base material, for synthesizing high quality diamond with smaller damage to the base material.

A diamond synthesizing method according to the present invention deposits diamond on a base material from a vapor phase using a raw material gas prepared by diluting a compound containing carbon atoms with gaseous hydrogen, and comprises a step of irradiating the raw material gas or the base material with a laser beam satisfying at least either an oscillation spread angle within a range of at least about $1 \times 10^{-2}$ mrad and not more than about $5\times10^{-1}$ mrad or a half-power band width within the range of at least about $1\times10^{-4}$ nm and not more than about $1\times10^{-1}$ nm with respect to a band width of an oscillation wavelength, and having a wavelength within a range of about 190 nm to 360 nm thereby decomposing the compound and the gaseous hydrogen, and a step of depositing the diamond on the base material from the decomposed raw material gas.

According to the present invention, a laser source can be prepared from an ArF excimer laser (wavelength: 193 nm), a KrCl excimer laser (wavelength: 222 nm), a KrF excimer laser (wavelength: 248 nm), an XeCl excimer laser (wavelength: 308 nm), an $N_2$ excimer laser (wavelength: 337 nm) or an XeF excimer laser (wavelength: 353 nm), for example.

According to the present invention, the coherence of the laser beam is improved. While a laser beam generated by a laser oscillator conventionally has a spread angle of about 1 to 3 mrad, such an angle is within a range of at least about $1\times10^{-2}$ mrad and not more than about $5\times10^{-1}$ mrad according to the present invention. Further, on the one hand a half-power band width of an oscillation wavelength is about 1 to 2 nm in a conventional laser beam, on the other hand such a half-power band width is within a range of at least about $1\times10^{-4}$ nm and not more than about $1\times10^{-1}$ nm according to the present invention. Thus, the band of the laser beam is narrowed according to the present invention, whereby an improvement of the coherence can be attained by using an instable resonator, or by using amplified seed light, whose band width is narrowed by an etalon, a prism or a grating, with a resonator.

According to the present invention, it is preferable to suppress the dispersion of energy intensity in a plane perpendicular to an optical axis of the laser beam to a level of not more than about 10% of an average energy intensity, in order to form homogeneous diamond on a prescribed region of the base material.

Such averaging of energy in a section of the laser beam can be attained by a method of combining a prism and a lens for dividing the laser beam cross-section into parts and thereafter reconstructing the same, or a method of cutting a central portion of the beam having relatively homogeneous energy distribution by a mask, for example.

According to the present invention, a pulsed laser beam is mainly employed, whereby a high repetition laser oscillator is preferably employed since it is possible to increase the film forming rate by increasing the pulse repetition rate. Further, it is preferable to employ an apparatus which can generate high energy since the film forming rate is improved as the energy density of the laser is increased.

According to the present invention, the compound and the gaseous hydrogen contained in the vapor phase are decomposed and excited in a region irradiated with the laser beam, whereby the formation of diamond progresses only on this region. Therefore, when an optical path of the laser beam is fixed and the base material is moved, for example, it is possible to form diamond on a portion of the base material which is located under the optical path of the laser beam. More specifically, it is possible to form a homogeneous and flat film on a region of the base material which is irradiated with the laser beam by linearly focusing the laser beam on the base material with cylindrical lens and uniaxially driving (translating or rotating) the base material, relative to the driving of the base material. While the base material is driven in the above example, it is also possible to form diamond on an arbitrary region of the base material by moving the laser beam. Thus, according to the present invention, it is possible to grow diamond on any desired region of the base material by simply changing the positional relation between the laser beam and the base material.

The raw material gas employed in the present invention, which necessarily contains gaseous hydrogen ($H_2$), can contain an arbitrary compound as a carbon source material. According to the present invention, the compound containing carbon atoms can be prepared from an organic compound, such as saturated hydrocarbon such as methane, ethane or propane, unsaturated hydrocarbon such as acetylene, benzene or xylene, alcohol such as methanol or ethanol, ester such as methyl acetate, phenol such asphenol or O-cresol, ether such as ethyl ether, ketone such as acetone, aldehyde such as formaldehyde, or halogenated carbon such as carbon tetrachloride, for example. It is now, for example, possible to select as the raw material an organic compound that does not have a wavelength in its absorption band corresponding to that of the laser beam used in the treatment. Thus, the selection permits avoiding acetylene etc. having an absorption band at 193 nm and to select saturated hydrocarbon such as methane when an ArF excimer laser (wavelength: 193 nm) is employed, for example.

According to the present invention, it is possible to add at least one further gas selected from the group of helium, argon, krypton, xenon and radon to the raw material gas, in order to facilitate the formation of diamond. In addition to such a gas, its concentration is preferably at least about 10 ppm and not more than about 30%. No effect is attained by the addition of the further gas if the concentration is not more than about 10 ppm, while concentration of a precursor for forming diamond is so reduced that the addition of a further gas is in vain if the concentration exceeds about 30%.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A typical laser beam having a wavelength of about 190 nm to 360 nm is an excimer laser beam. This excimer laser beam is inferior in coherence to other laser beams having large wavelengths. In other words, the excimer laser beam generally has a relatively large spread angle, as well as a certain width as to its oscillation wave length. In conventional laser CVD the coherence of the employed excimer laser beam has not been considered to be significant to the formation of diamond. However, the inventors have found that in using an excimer laser beam for CVD the coherence of the laser beam is extremely important for the formation of high quality diamond. We have also found that it is possible to form high quality diamond at a low temperature by improving the coherence of an excimer laser without employing other auxiliary means such as plasma forming means.

Figure 1:
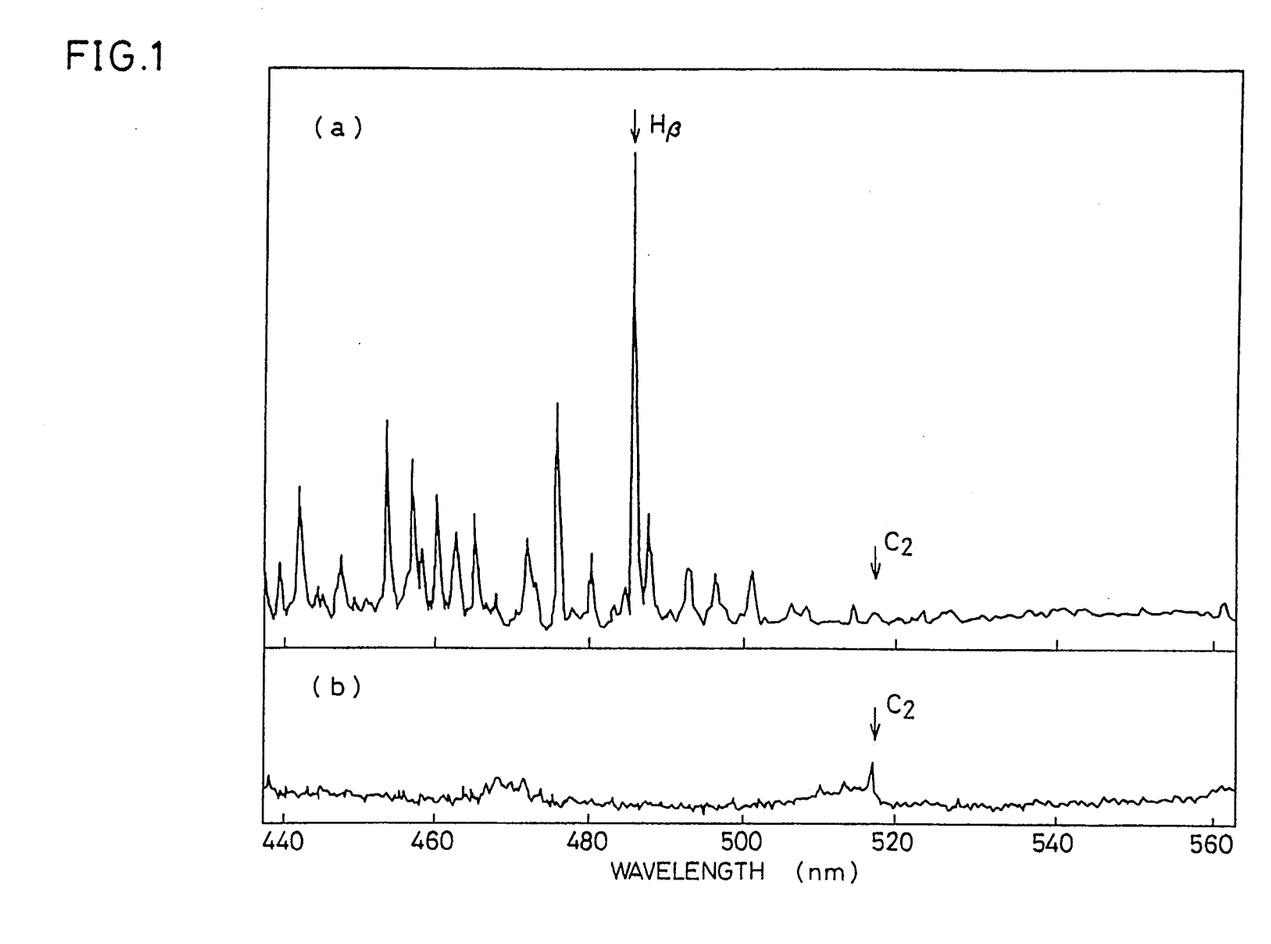
FIG. 1 illustrates emission spectra observed as a result of an irradiation with excimer laser beams employed in the present invention curve (a), and in the prior art curve (b) respectively.

FIG. 1 shows an emission spectrum which was obtained when a raw material gas (99% of hydrogen and 1% of methane) prepared by diluting methane with hydrogen, was irradiated with an ArF excimer laser beam having a spread angle of not more than about $5 \times 10^{-1}$ mrad during oscillation and a half-power band width of not more than about $1 \times 10^{-1}$ nm with respect to a band width of an oscillation wavelength according to the present invention illustrated by curve (a). FIG. 1 also shows an emission spectrum which was obtained when a raw material gas (99% of hydrogen and 1% of acetylene) prepared by diluting acetylene with gaseous hydrogen, was irradiated with a conventionally employed ArF excimer laser beam having a spread angle of about 3 mrad during oscillation and a band width of an oscillation wavelength of about 2 nm according to a conventional method illustrated by curve (b). Referring to FIG. 1, observed in curve (a) are peaks indicating that a number of chemical species which are important for diamond synthesis are generated upon 5 irradiation with the laser beam according to the present invention, as well as a strong emission indicating generation of atomic hydrogen $H\beta$. On the other hand, observed in curve (b) is only an emission at $C_2$, with no emission of atomic hydrogen.

While a vapor deposition mechanism of diamond has not yet been completely explicated under the present circumstances, it has been clarified by the findings made by the inventors that atomic hydrogen which is generated by decomposition of gaseous hydrogen has an extremely important effect on the diamond synthesis. Further, while the inventors have not yet completely explicated the cause for formation of profiles of chemical species which are suitable for diamond synthesis upon irradiation with a laser beam having a high coherence as shown in curve (a) in FIG. 1, it is believed that a strong electric field is locally formed to provide a plasma state by the improvement of the coherence of the laser beam, and that multiple photon absorption and/or decomposition is facilitated by an extremely high energy concentration. In either case, it is possible to decompose the raw material gas also in a wavelength band that generally does not cause any absorption and/or decomposition, by improving the coherence of the excimer laser.

When a further gas such as helium, argon, krypton, xenon or radon is added to the raw material gas and this raw material gas is irradiated with the laser beam according to the present invention, the intensity of its emission spectrum is increased. Thus, it is possible to promote the decomposition of the raw material gas by adding such a further gas to the raw material gas, thereby improving the formation rate of diamond.

Thus, according to the present invention, it is possible to generate chemical species which are suitable for diamond synthesis from the raw material gas by improving the coherence of the laser beam, thereby forming high quality diamond at a low temperature.

According to the present invention, the spread angle of the laser beam during oscillation is set in the range of about $1 \times 10^{-2}$ to $5 \times 10^{-1}$ mrad, in order to improve coherence of the laser beam. When the spread angle exceeds about $5 \times 10^{-1}$ mrad, aberration is so increased that the required energy density cannot be obtained due to dispersion of energy. On the other hand, it is technically difficult to reduce the spread angle to less than about $1 \times 10^{-2}$ mrad, and no sufficient effect can be expected even if the spread angle can be reduced below this value. Further, according to the present invention, the half-power band width is set at about $10^{-4}$ to $10^{-1}$ nm as to a band width of an oscillation wavelength, in order to improve the coherence of the laser beam. It is impossible to sufficiently decompose and excite the raw material gas if the half-power band width exceeds about $10^{-1}$ nm, while it is impossible to obtain energy which is required for decomposing the raw material gas if the half-power band width is less than about $10^{-4}$ nm.

In the present invention, it is to be noted that a compound such as methane having no absorption band for the wavelength of the laser beam, can be employed as a carbon source, as hereinabove described. When CVD is carried out with a compound not absorbing any laser beam, it is possible to cause decomposition of the carbon material only in a region on which the laser beam is focused and a region close thereto. Therefore, decomposition of the raw material gas progresses in a portion separated from a window for transmitting the laser beam in a chamber for the CVD process, whereby the window is not stained. On the other hand, if a compound having the wavelength of the laser beam in its absorption band is used, the decomposition of the raw material gas is caused everywhere. When the absorption and/or decomposition progresses particularly in the vicinity of the window, sooty products adhere to the window to reduce the transmissivity of the window for the laser beam. Finally, the laser beam is no longer applied with a sufficient energy so that diamond cannot be synthesized. While an inert gas or gaseous hydrogen may be sprayed onto the inner side of the window in order to solve this problem, this method is not necessarily preferable in consideration of any influence caused by diffusion of the gas.

A cross-section of an excimer laser beam generally has a rectangular shape of about 10 mm by 30 mm, with a heterogeneous energy profile in its distribution which can be approximated as a Gaussian distribution. Namely, the laser energy intensity is high at a central portion and low at a peripheral portion across such a section of the laser beam. This fact does not cause any problem when the laser beam is focussed, since diamond may be heterogeneously formed when a substrate is irradiated with a focussed laser beam. However, it is possible to improve the accuracy of the diamond formation by suppressing the energy dispersion in the sectional direction within about 10% of average energy. Thus, it is possible to substantially eliminate any influence exerted by energy dispersion on the formation of diamond.

The inventors have further found that it is possible to flatly and homogeneously form diamond by simply linearly focusing a laser beam on a base material with a cylindrical lens and uniaxially driving (translating or rotating) the base material. Although the cause for this has not yet been explicated, it is possible that an energy distribution is cancelled by unidirectional condensation.

As hereinabove described, the following effects can be attained according to the present invention:

(1) A large amount of atomic hydrogen can be generated with a laser beam in the vicinity of an irradiated point with no additional apparatus such as plasma generation means, whereby it is possible to form high quality diamond economically in a simple apparatus.

(2) No thermal means is employed since the base material is not additionally heated by generation of plasma, which is contrary to plasma CVD, whereby it is possible to form high quality diamond at a lower temperature as not more than about 300° C., for example, by generating efficiently excited active species on the base material and in a portion extremely close to the base material.

(3) The raw material containing carbon atoms can be decomposed and/or excited with a laser beam of a wavelength allowing no absorption, whereby it is possible to form diamond without staining a window for the laser beam by decomposing the raw material gas only in a region on which the laser beam is focused or a region close thereto.

(4) Diamond can be deposited by decomposing the raw material gas on a portion of the base material on which the laser beam is focussed, whereby it is possible to form diamond on any desired region of a base material having a complicated shape by three-dimensionally driving the laser beam and the base material.

(5) It is possible to obtain a homogeneous and flat diamond film by linearly focusing the laser beam and uniaxially driving the base material.

(6) It is possible to freely control the thickness of the diamond film by changing the operation speed for the base material, laser energy density, the laser oscillation pulse frequency and the like.

EXAMPLE 1

An ordinary vacuum vessel was employed as a chamber for laser CVD, and a raw material gas was prepared from a mixed gas containing 99% of hydrogen and 1% of methane. A glass base material was scraped with diamond abrasive grains of #5000 and then placed in the vacuum vessel, which in turn was supplied with the raw material gas under decompression in accordance with a conventional method.

Then, the base material was heated with a kanthal heater to about 300° C., and a portion of about 1 mm above the glass base material was irradiated with an XeCl excimer laser beam, which was obtained by amplifying and/or oscillating seed light whose band was narrowed by a grating and a prism, through a window of fused quartz provided in the vacuum vessel. The current half-power band width of the laser beam measured with a Fabry-Perot interferometer was about $1.0 \times 10^{-1}$ nm. Further, the emitted laser energy was about 100 mJ. The temperature was measured with a thermocouple.

Figure 2:
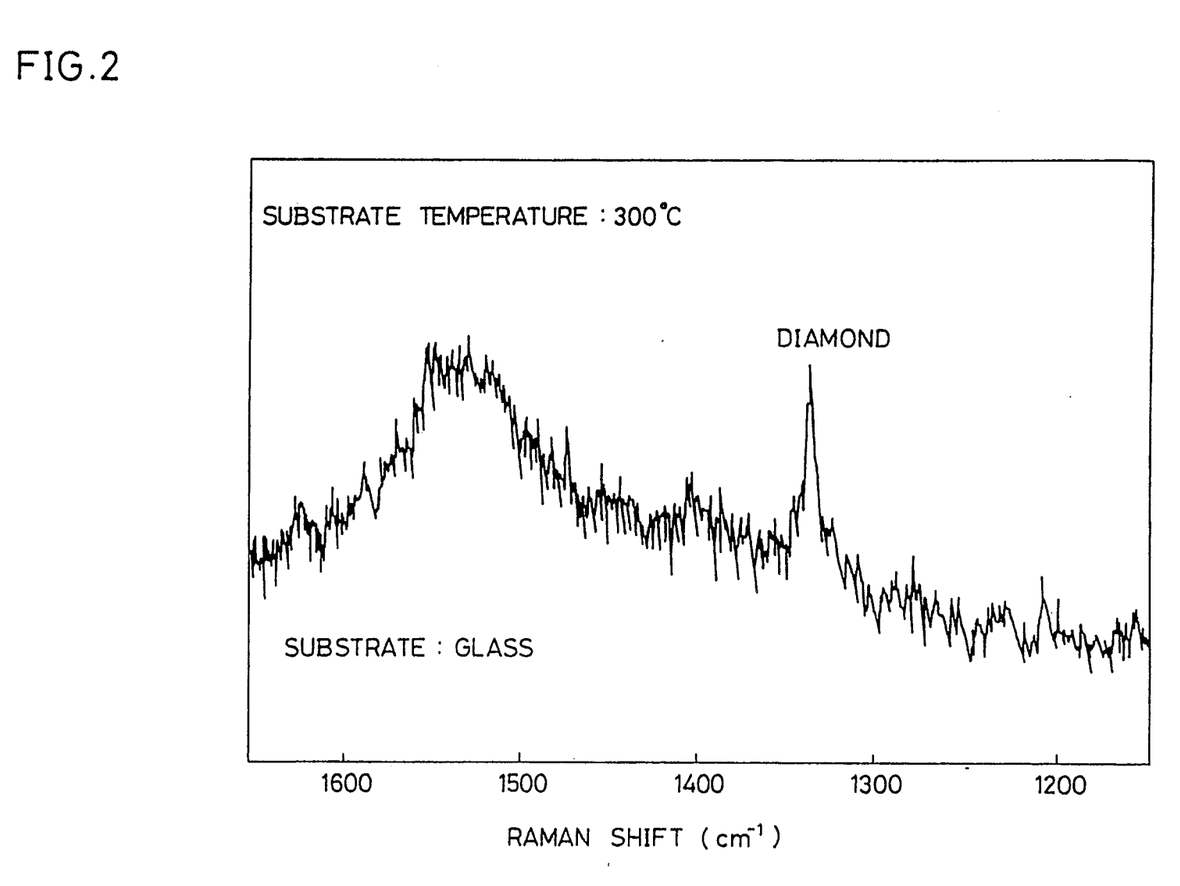
FIG. 2 illustrates a Raman spectrum of a film obtained in Example 1 according to the present invention.

After irradiation with the laser beam for about 1 hour, the base material was taken out from the vacuum vessel and analyzed, whereby the as-formed film exhibited the Raman spectrum shown in FIG. 2. A strong diamond peak (1333 cm$^{-1}$) was recognized in this spectrum, to prove that a high quality diamond film was obtained. This diamond film had a thickness of about 0.1 μm.

EXAMPLE 2

A base material was prepared from an aluminum base material, and a raw material gas was prepared from a mixed gas containing 99% of hydrogen and 1% of methane. The base material was placed in a vacuum vessel, which in turn was supplied with the raw material gas in accordance with a conventional method.

Then, an XeF excimer laser beam, which was obtained by amplifying and/or oscillating seed light whose band was narrowed by a grating and a prism with an instable resonator, was focussed on a portion of about 1 mm above the aluminum base material through a window of fused quartz provided in the vacuum vessel. The current half-power band width of the laser beam measured with a Fabry Perot interferometer was about $1.0 \times 10^{-4}$ nm. Further, the laser beam had a spread angle of about $5 \times 10^{-2}$ mrad and laser energy of about 100 mJ was emitted. The temperature was measured with a thermocouple, and the base material was heated to about 200° C. with a kanthal heater in CVD.

Figure 3:
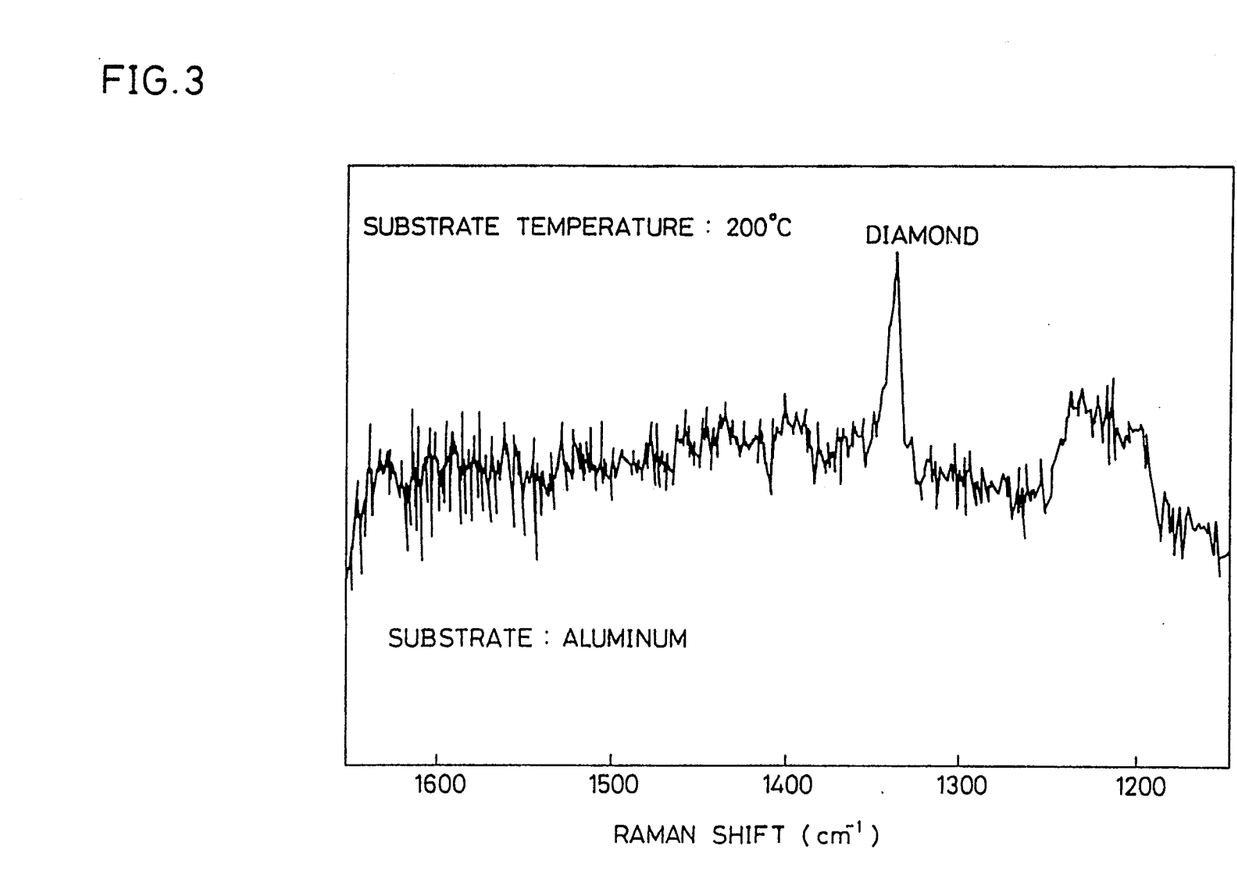
FIG. 3 illustrates a Raman spectrum of a film obtained in Example 2 according to the present invention.

After irradiation with the laser beam for about 1 hour, the base material was taken out from the vacuum vessel and analyzed, whereby a film exhibiting the Raman spectrum shown in FIG. 3 was obtained. This Raman spectrum, which had a strong diamond peak (1333 cm$^{-1}$), indicated that a high quality diamond film was formed. The as-obtained diamond film had a thickness of about 0.7 μm.

EXAMPLE 3

An aluminum base material was placed in an ordinary vacuum vessel, which in turn was supplied with a raw material gas containing 99% of hydrogen and 1% of methane. The base material was heated with a kanthal heater to about 400° C., and an ArF excimer laser beam which was oscillated with an instable resonator was condensed on a portion of about 1 mm above the heated aluminum base material. At this time, the laser beam exhibited a spread angle of about $1.0 \times 10^{-2}$ mrad and emitted laser energy of about 500 mJ. The temperature was measured with a thermocouple.

After irradiation with the laser beam for about 1 hour, the base material was taken out from the vacuum vessel and subjected to Raman spectral analysis, whereby it was proven that a high quality diamond film was formed on the base material. The as-obtained diamond film had a thickness of about 0.1 μm.

EXAMPLE 4

A raw material gas was prepared by adding 5% of argon gas to the mixed gas containing 99% of hydrogen and 1% of methane employed in Example 1, 2 or 3. An aluminum base material was placed in an ordinary vacuum vessel, which in turn was supplied with the raw material gas. Then the base material was heated with a kanthal heater to about 200° C., and an XeCl excimer laser beam, which was obtained by amplifying and/or oscillating seed light whose band was narrowed by a grating and a prism with an instable resonator, was focussed on a portion of about 1 mm above the heated aluminum base material through a window of fused quartz. The current half-power band width of the laser beam measured with a Fabry-Perot interferometer was about $1.0 \times 10^{-4}$ nm. The laser beam had a spread angle of about $1.0 \times 10^{-2}$ mrad and emitted laser energy of about 100 mJ. The temperature was measured with a thermocouple.

After irradiation with the laser beam for about 1 hour, the base material was taken out from the vacuum vessel and analyzed, whereby it was proven that a high quality diamond film was obtained. The diamond film had a thickness of about 1.2 μm.

EXAMPLE 5

A raw material gas was prepared by adding 1% of helium to a mixed gas containing 99% of hydrogen and 1% of methane. An aluminum base material was placed in an ordinary vacuum vessel, which in turn was supplied with the raw material gas in accordance with a conventional method.

Then, an ArF excimer laser beam, which was obtained by amplifying and/or oscillating seed light whose band was narrowed by a grating and a prism with an instable resonator, was focussed on a portion of about 1 mm above the aluminum base material through a window of fused quartz provided in the vacuum vessel. The current half-power band width of the laser beam measured with a Fabry-Perot interferometer was about $1.0 \times 10^{-4}$ nm. Further, the laser beam had a spread angle of about $1.0 \times 10^{-2}$ mrad, and emitted laser energy of about 100 mJ. The base material was heated with a kanthal heater to about 200° C., and the temperature was measured with a thermocouple.

After irradiation with the laser beam for about 1 hour, the base material was taken out from the vacuum vessel and analyzed, whereby it was proven that a high quality diamond film was formed on the base material. This diamond film had a thickness of about 1.5 μm.

EXAMPLE 6

An aluminum base material was placed in an ordinary vacuum vessel, which in turn was supplied with a raw material gas containing 99% of hydrogen and 1% of methane.

An ArF excimer laser, which was obtained by amplifying and/or oscillating seed light whose band was narrowed by a grating and a prism with an instable resonator, was focussed on a portion of about 1 mm above the aluminum base material through a window of fused quartz provided in the vacuum vessel. The laser beam had a spread angle of about $5 \times 10^{-2}$ mrad, with a half-power band width, measured with a Fabry-Perot interferometer, of about $1.0 \times 10^{-4}$ nm and laser energy of about 100 mJ was emitted.

The laser beam was linearly focussed with a cylindrical lens during irradiation, while the aluminum base material was heated with a kanthal heater to about 200° C., and rotated at 60 r.p.m. The temperature was verified with a thermocouple.

After irradiation with the laser beam for about 10 minutes, the base material was taken out from the vacuum vessel and analyzed, whereby it was proven that a high quality diamond film was homogeneously formed on a substrate of 60 mm in diameter. The diamond film had a thickness of about 0.5 μm.

EXAMPLE 7

An alumina base material was placed in an ordinary vacuum vessel, which in turn was supplied with a raw material gas containing 99% of hydrogen and 1% of methane.

The alumina substrate was irradiated with an ArF excimer laser beam, which was obtained by amplifying and/or oscillating seed light whose band was narrowed by a grating and a prism with an instable resonator and homogenizing its energy profile with a homogenizer comprising in combination a prism and a lens, through a window of fused quartz provided in the vacuum vessel. The current half-power band width of the laser beam measured with a Fabry-Perot interferometer was about $1.0 \times 10^{-4}$ nm. This laser beam had a spread angle of about $5 \times 10^{-2}$ mrad, while the difference between maximum and minimum levels of energy distribution observed with a profiler was about 9.5% of an average energy intensity. The emitted laser energy was about 100 mJ.

During irradiation, a convex lens was employed to focus the laser beam to 1 mm by 3 mm square. The aluminum base material was heated with a kanthal heater to about 200° C., and parallelly driven through a path of 10 mm at a constant velocity. The temperature was verified with a thermocouple.

After irradiation with the laser beam for 10 minutes, the base material was taken out from the vacuum vessel and analyzed, whereby it was proven that a high quality diamond film was homogeneously formed with a width of 3 mm and a length of 10 mm. This film had a thickness of about 0.5 μm.

EXAMPLE 8

A polyethylene base material was prepared by scraping with diamond powder having the diameter of 1-10 μm. The polyethylene base material was placed in an ordinary vacuum vessel, which in turn was supplied with a row material gas containing 99% of hydrogen, 0.5% of methane and 0.5% of carbon monoxide. The pressure in the vessel was about 40 Torr. The base material was irradiated with an ArF excimer laser beam, which was obtained by amplifying and/or oscillating seed light whose band was narrowed by a grating and a prism with an instable resonator and homogenizing its energy profile with a homogenizer having a prism and a lens. The current half-powder band width of the laser beam measured with a Fabry-Perot interferometer was about $1.0 \times 10^{-4}$ nm. This laser beam had a spread angle of about $5 \times 10^{-2}$ mrad. During irradiation, the laser beam was focused to the diameter of 30 μm with a convex lens having a 500 nm focus. The base material was parallelly driven through a path of 10 nm at a constant velocity. The film formation was performed at room temperature. The temperature was verified with a thermocouple. The emitted laser energy was about 120 mJ. After irradiation with the laser beam for 10 minutes, the base material was taken out from the vacuum vessel and analyzed, whereby it was proven that a high quality diamond film was homogeneously formed with a width of 3 mm and a length of 10 mm. This film had a thickness of about 0.5 μm.

COMPARATIVE EXAMPLE

A raw material gas was prepared from a mixed gas containing 99% of hydrogen and 1% of acetylene. An Si base material, capable of easily retaining diamond having relatively excellent crystallinity, was placed in an ordinary vacuum vessel, which in turn was supplied with the raw material gas in accordance with a conventional method. Then, the base material was irradiated with an ArF excimer laser under conditions of a spread angle of about 3 mrad, a half-power band width of about 2 nm, and a laser energy of about 100 mJ in accordance with the prior art. The base material was heated to about 300° C. When the base material was thus irradiated with the laser beam in accordance with the prior art, only sooty products adhered onto the base material, without any formation of diamond.

Figure 4:
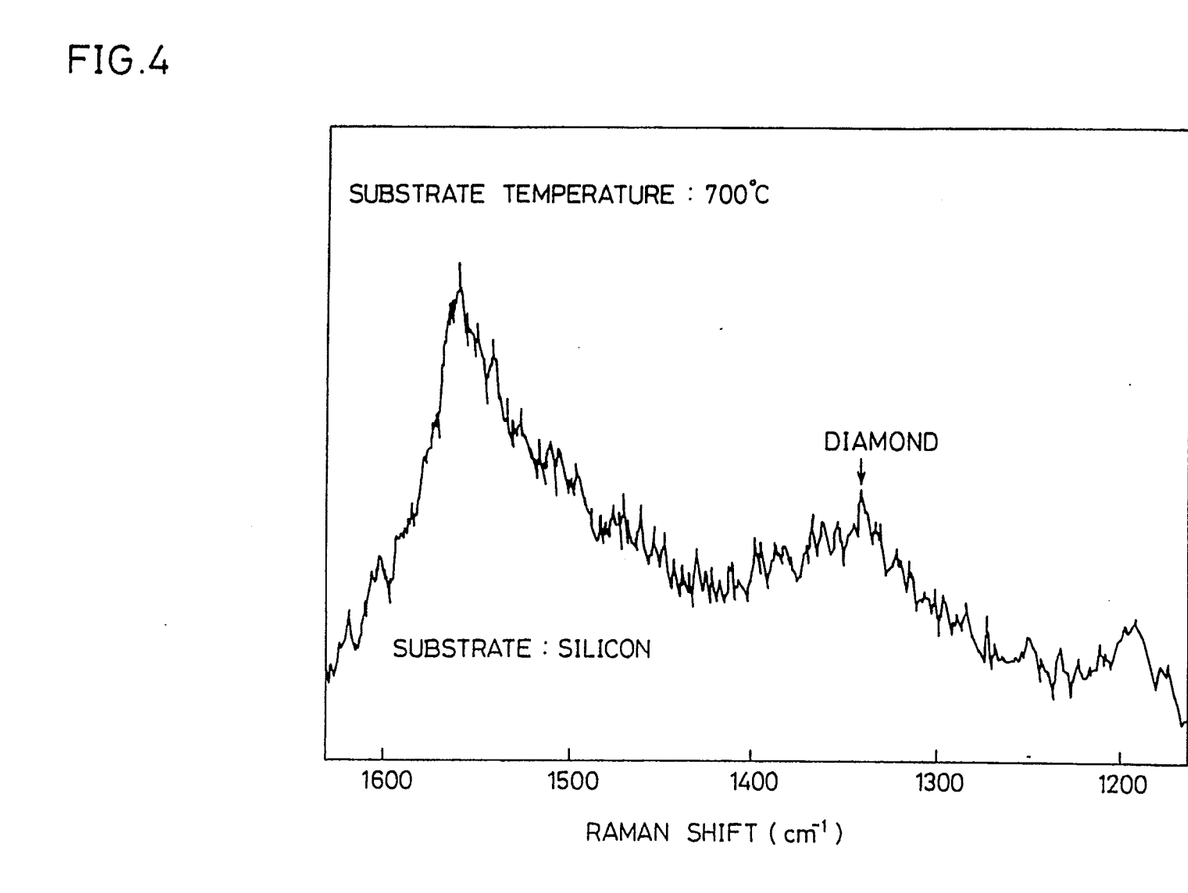
FIG. 4 illustrates a Raman spectrum in a film obtained according to a comparative example.

In laser irradiation, dc plasma was added and the substrate temperature was set at a relatively high level of about 700° C., to experimentally synthesize diamond. As the result, a Raman spectrum shown in FIG. 4 was obtained. As shown, the diamond peak at 1333 cm$^{-1}$ was extremely weak and broad in this spectrum.

Although the present invention has been described and illustrated in detail, it is clearly understood that the same is by way of illustration and example only and is not to be taken by way of limitation, the spirit and scope of 15 the present invention being limited only by the terms of the appended claims.

What is claimed is:

1. A laser CVD method for synthesizing diamond on a base material from a vapor phase comprising the following steps:
   (a) using a raw material gas prepared by diluting a compound consisting essentially of saturated hydrocarbon with gaseous hydrogen,
   (b) irradiating said raw material gas or said base material with a laser beam satisfying at least one of the following conditions: maintaining during oscillation a spread angle within a range of at least about $1 \times 10^{-2}$ mrad and not more than about $5 \times 10^{-1}$ mrad, or a half-power band width within a range of at least about $1 \times 10^{-4}$ nm and not more than about $1 \times 10^{-1}$ nm with respect to a band width of an oscillation having a wavelength within a range of about 190 nm to 360 nm for decomposing said compound and said gaseous hydrogen to form decomposed raw material gas; and
   (c) depositing the diamond on said base material from said decomposed raw material gas.

2. The method in accordance with claim 1, wherein a dispersion of an energy intensity in a plane perpendicular to an optical axis of said laser beam is at the most 10% of an average energy intensity.

3. The method in accordance with claim 1, wherein said raw material gas includes at least one gas selected from the group consisting of helium, argon, neon, krypton, xenon and radon.

4. The method in accordance with claim 1, wherein said saturated hydrocarbon is methane.

5. A method in accordance with claim 1, wherein said raw material gas consists essentially of methane, hydrogen, and at least one gas selected from the group consisting of helium, argon, neon, krypton, xenon and radon.

6. The method in accordance with claim 1, comprising moving said base material relative to said laser beam thereby moving a region for deposition of said diamond on said base material.

7. The method in accordance with claim 1, wherein said laser beam is linearly focused on said base material and said base material is translated for forming a flat diamond film on a region of said base material being irradiated by said laser beam.

8. The method in accordance with claim 1, comprising focussing said laser beam linearly on said base material and said base material is rotated for forming a flat diamond film on a region of said base material being irradiated by said laser beam.

9. The method in accordance with claim 1, comprising heating said base material to a temperature of not more than about 300° C.

10. The method in accordance with claim 1, wherein a laser source is selected from the group consisting of an ArF excimer laser, a KrCl excimer laser, a KrF excimer laser, an XeCl excimer laser, an N$_2$ excimer laser and an XeF excimer laser.

* * * * *